United States Patent [19]

Sanada

[11] Patent Number: 5,329,139
[45] Date of Patent: Jul. 12, 1994

[54] SEMICONDUCTOR INTEGRATED CIRCUIT DEVICE ANALYZABLE BY USING LASER BEAM INDUCING CURRENT

[75] Inventor: Masaru Sanada, Tokyo, Japan

[73] Assignee: NEC Corporation, Japan

[21] Appl. No.: 38,607

[22] Filed: Mar. 29, 1993

[30] Foreign Application Priority Data

Apr. 2, 1992 [JP] Japan .................. 4-080151

[51] Int. Cl.[5] .............. H01L 27/02; H01L 23/48
[52] U.S. Cl. ....................... 257/48; 257/431; 257/758; 257/911
[58] Field of Search .............. 257/48, 431, 758, 911

[56] References Cited

U.S. PATENT DOCUMENTS 4,881,029 11/1989 Kawamura .................. 257/48

OTHER PUBLICATIONS

"Logic Failure Analysis of CMOS VLSI Using a Laser Probe", F. J. Henley, IEEE, Proceedings of the International Reliability Physics Symposium, 1990, pp. 69-75.

Primary Examiner—Mark V. Prenty
Attorney, Agent, or Firm—Laff, Whitesel, Conte & Saret

[57] ABSTRACT

A semiconductor integrated circuit device is subjected to a non-contact and non-destructive analysis using a laser beam after fabrication process, and impurity regions are previously formed in an area assigned to wiring strips regardless of the circuit components, wherein the impurity regions are selectively coupled with the wiring strips for supplying optical beam induced current to a target circuit component so as to analyze the switching action of the target circuit component.

4 Claims, 11 Drawing Sheets

SEMICONDUCTOR INTEGRATED CIRCUIT DEVICE ANALYZABLE BY USING LASER BEAM INDUCING CURRENT

FIELD OF THE INVENTION

This invention relates to a semiconductor integrated circuit device and, more particularly, to a semiconductor integrated circuit device analyzable by using laser beam for inducing current detectable at pins.

DESCRIPTION OF THE RELATED ART

A non-contact and non-destructive analysis provides functional information of a semiconductor integrated circuit device to an analyst, and allows the analyst to trace the operational sequences of the circuit components. One of the non-contact and non-destructive analyzing methods uses a laser beam such as a He-Ne laser beam, and the laser beam is radiated onto the surface of the semiconductor integrated circuit device over the drain of a component field effect transistor. The laser beam induces optical beam induced current, and the optical beam induced current is taken out from an associated pin of the semiconductor integrated circuit device for analysis of the operational sequences. The non-contact and non-destructive analysis is described by F. J. Henley in "LOGIC FAILURE ANALYSIS OF CMOS VLSI USING A LASER PROBE", IEEE, Proceedings of the International Reliability Physics Symposium, 1994, pages 69 to 75.

FIG. 1 illustrates a typical example of the analyzer for the optical beam induced current, and the analyzer largely comprises a He-Ne laser oscillator 1, a microscope 2, an x-y stage system 3, a computer unit 4, a detector for optical beam induced current, and a power voltage/test signal generator 6. A semiconductor integrated circuit device 7 is mounted on a stage 3a, and the stage 3a and, accordingly, the semiconductor integrated circuit device 7 are two-dimensionally movable with respect to the microscope 2 by a stage driver 3b. The laser oscillator 1 generates a laser beam 1a, and the laser beam 1a is radiated into the microscope 2. The laser beam is deflected in the microscope 2, and is incident onto the semiconductor integrated circuit device 7. The x-y stage system 3 allows an analyst to focus the laser beam onto a target area over the drain of a component field effect transistor incorporated in the semiconductor integrated circuit device, and the power voltage/test signal generator 6 supplies a power voltage GND and test signals appropriate to allow the drain to be coupled with one of the pins 7a.

As shown in FIG. 2, the detector 5 comprises a resistor coupled between a pin 7a associated with the component field effect transistor and a power voltage line Vdd, an amplifier 5b coupled with the resistor 5a and an analog-to-digital converter 5c coupled with the computer unit 4, and power voltage Vdd is supplied from the power voltage/test signal generator 6 through the resistor 5a to the pin 7a of the semiconductor integrated circuit device 7. While the laser beam 1a is focused on the target area, optical beam induced current takes place, and causes the voltage level at the pin 7a to vary. Since the pin 7a is coupled through the resistor 5a with the power voltage line Vdd, the resistor 5a detects the variance dVph in voltage level. The variance dVph is amplified by the amplifier circuit 5b, and is relayed from the amplifier circuit 5b to the analog-to-digital converter 5c. The analog-to-digital converter 5c produces a digital signal indicative of the variance dVph, and the digital signal is supplied from the analog-to-digital converter 5c to the computer 4 for analysis.

Using the analyzer thus arranged, a complementary inverter is assumed to be analyzed, and the complementary inverter is implemented by a series combination of a p-channel enhancement type field effect transistor 17a and an n-channel enhancement type field effect transistor 17b as shown in FIG. 3.

First, description is made on the structure of the complementary inverter with reference to FIG. 4A and 4B. The n-channel enhancement type field effect transistor 17b is fabricated on a p-type semiconductor substrate 17c, and the p-channel enhancement type field effect transistor 17a is fabricated on an n-type well 17d defined in the p-type semiconductor substrate 17c.

The p-channel enhancement type field effect transistor 17a comprises a p-type source region 17e formed in the n-type well 17d, a p-type drain region 17f formed in the n-type well 17d in spacing relation from the p-type source region 17e, and a gate electrode 17g provided on a gate oxide film over a channel region between the p-type source and drain regions 17e and 17f. The gate electrode 17g is coupled with a data input pin IN, and the p-type source region 17e is coupled with a power supply pin Pdd. The n-type well 17d is connected through a heavily doped contact region 17h with the power supply pin Pdd, and the power voltage level Vdd reversely biases the p-n junction between the p-type semiconductor substrate 17c and the n-type well 17d. The power supply pin Pdd is coupled through the register 5a of the detector 5 with the power voltage line Vdd, and the p-type drain region 17f is coupled with a data output pin OUT. The data output pin OUT is corresponding to the pin 7a in FIG. 2.

The n-channel enhancement type field effect transistor 17b comprises an n-type source region 17i formed in the p-type semiconductor substrate 17c, an n-type drain region 17j formed in the p-type semiconductor substrate 17c in spacing relation from the n-type source region 17i, and a gate electrode 17k provided on a gate oxide film over a channel region between the n-type source region 17i and the n-type drain region 17j. The gate electrode 17k is coupled with the data input pin IN, and the p-channel enhancement type field effect transistor 17a and the n-channel enhancement type field effect transistor 17b complementarily turns on and off with an input data signal at the data input pin IN. The p-type semiconductor substrate 17m is connected through a heavily doped n-type contact region 17m with a ground voltage line which in turn is coupled with a power supply pin Pgnd. The n-type source region 17i is coupled with the power supply pin Pgnd, and the drain region is coupled with the data output pin OUT. The The p-type semiconductor substrate 17c is covered with a transparent oxide film 17n, and the transparent oxide film 17n allows a laser beam to reach the drain regions 17f and 17j. While the power voltage/test signal generator 6 supplies the input data signal IN of high voltage level corresponding to logic "1" level to the data input pin IN, the p-channel enhancement type field effect transistor 17a turns off, and the n-channel enhancement type field effect transistor 17b turns on. The laser beam incident on the drain region 17j produces electron-hole pairs, and the holes are moved through the p-type semiconductor substrate 17c to the heavily doped n-type contact region 17m as shown in FIG. 4A.

On the other hand, the electrons flow through the channel region into the n-type source region 17i, and the holes and the electrons are recombined with one another, because the heavily doped n-type contact region 17m is electrically connected with the n-type source region 17i. As a result, no optical beam induced current takes place.

However, while the input data signal of low voltage level is supplied from the power voltage/test signal generator 6, the p-channel enhancement type field effect transistor 17a turns on, and the n-channel enhancement type field effect transistor 17b turns off. In this situation, Although the holes flows into the heavily doped n-type contact region 17m, the electrons behaves in a different manner from that shown in FIG. 3A. Namely, the p-channel enhancement type field effect transistor 17a allows the electrons to flow from the n-type drain region 17j through the p-type drain region 17f to the p-type source region 17e, and current Iph flows from the power supply line Vdd through the resistor 5a of the detector 5 to the power supply pin Pdd. As a result, the electrons causes the voltage level at the power supply pin Pdd to vary, and the detector 5 reports the variance dVph to the computer 4. Thus, the input data signal IN causes the variance to take place depending upon the logic level, and the analyst confirms the excellent switching action of the complementary inverter on the basis of the variance dVph. Even if an integrated circuit fabricated on a semiconductor substrate is complex, sequential radiation of laser beam information the analyst of actual switching actions, and allows the analyst to trace the switching sequence to see whether or not the integrated circuit contains a defective circuit component.

A semiconductor integrated circuit device is progressively increased in integration density, and the structure thereof becomes complex. The miniaturized complex semiconductor integrated circuit device makes the prior art non-contact and non-destructive analyzing method less effective. One of the reasons is the extremely narrow drain regions of the miniature component field effect transistors. Namely, the laser beam is hardly focused upon the extremely narrow drains, and is simultaneously incident upon more than one drain region. Such a multiple selection is causative of erroneous diagnosis. Another reason is a multi-level wiring structure over the semiconductor substrate. A complex circuit arrangement requires a complex wiring network, and the wiring strips are arranged in multiple layers. The multi-layered wiring strips are much liable to be overlapped with one another, and tend to interrupt the laser beam. This means that the laser beam can not reach the drain regions, and sequential radiation becomes impossible.

SUMMARY OF THE INVENTION

It is therefore an important object of the present invention to provide a semiconductor integrated circuit device which is analyzable with a laser beam regardless of complexity of the structure.

To accomplish the object, the present invention proposes to form irradiated impurity regions coupled with wiring strips in such a manner as not to be interrupted by the wiring strips.

In accordance with the present invention, there is provided a semiconductor integrated circuit device fabricated on a single semiconductor substrate of one conductivity type having a major surface, comprising: a) circuit components formed in a first area assigned thereto in the major surface; b) irradiated regions of the opposite conductivity type formed in a second area assigned to wiring strips in the major surface; and c) a multilayer wiring structure provided over the major surface in such a manner as to allow an optical radiation to be incident on any one of the irradiated regions, and having the wiring strips extending over said second area and selectively coupled with the circuit components and with the irradiated regions.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 5:
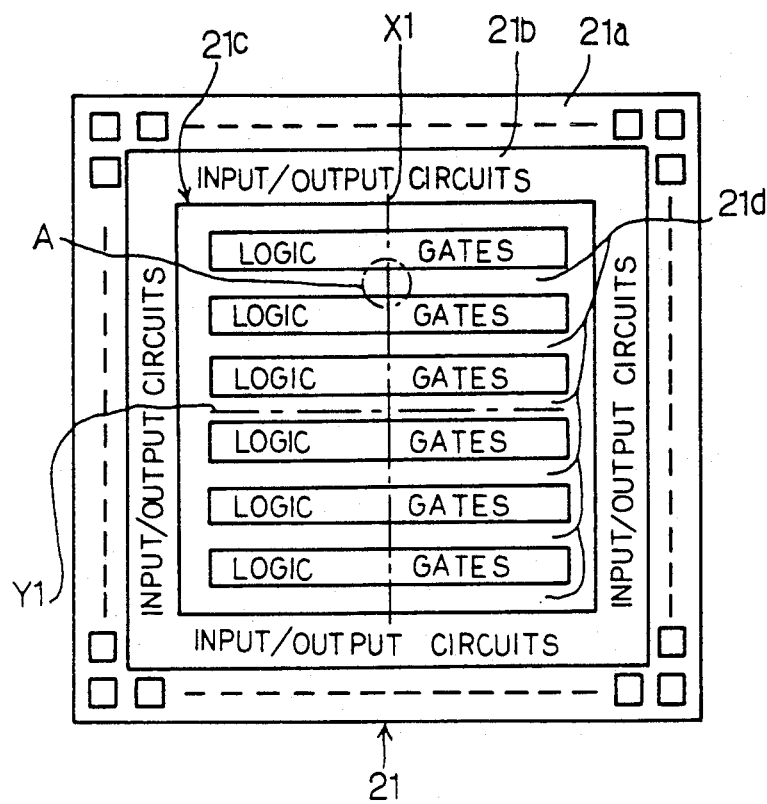
FIG. 5 is a plan view showing the layout of a semiconductor integrated circuit device according to the present invention.

Referring to FIG. 5 of the drawings, a semiconductor integrated circuit device embodying the present invention is fabricated on a p-type semiconductor substrate 21, and the semiconductor integrated circuit device is categorized into an ASIC (Application Specific Integrated Circuit) representative of a CMOS gate array. The major surface of the semiconductor chip 21 is largely broken down into an outermost peripheral area 21 assigned to bonding pads represented by small boxes, an inner peripheral area 21b assigned to input and output circuits and a central area 21c assigned to logic gates and interconnections. The logic gates are arranged in rows, and the rows of logic gates are spaced from one another. Wiring strips serving as the interconnections pass over a vacant area 21d between the rows of logic gates, and are coupled between the logic gates and between the logic gates and the input and output circuits.

In this instance, the logic gates are fabricated from complementary field effect transistors, and the complementary field effect transistors are designed by using sub-micron design rules.

Figure 1:
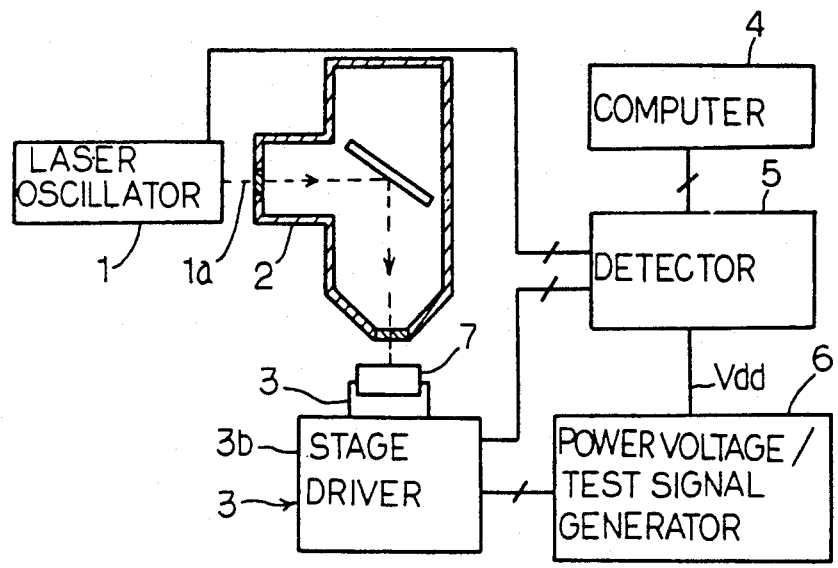
FIG. 1 is a block diagram showing the arrangement of the prior art non-contact and non-destructive analyzer.
Figure 2:
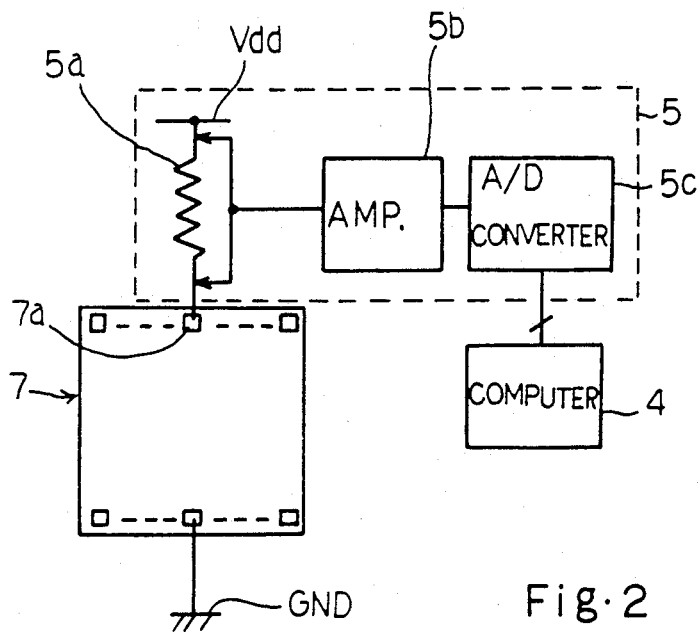
FIG. 2 is a block diagram showing the detector for the optical beam induced current incorporated in the prior art non-contact and non-destructive analyzer.
Figure 3:
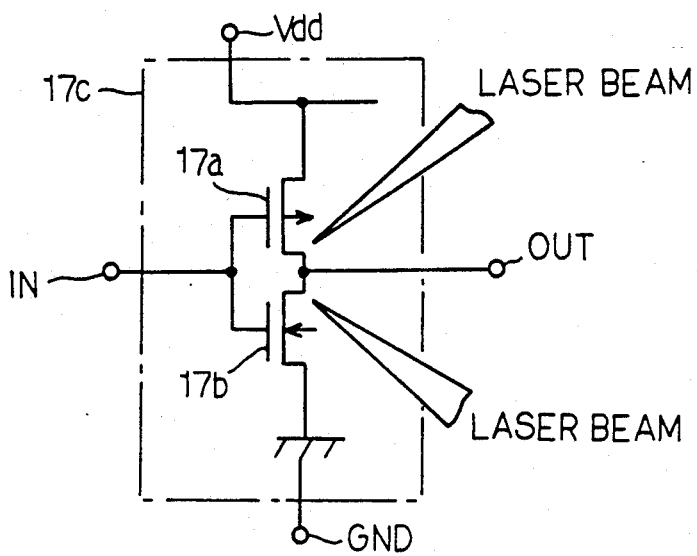
FIG. 3 is a circuit diagram showing the complementary inverter analyzed by using the prior art analyzer.
Figure 4A:
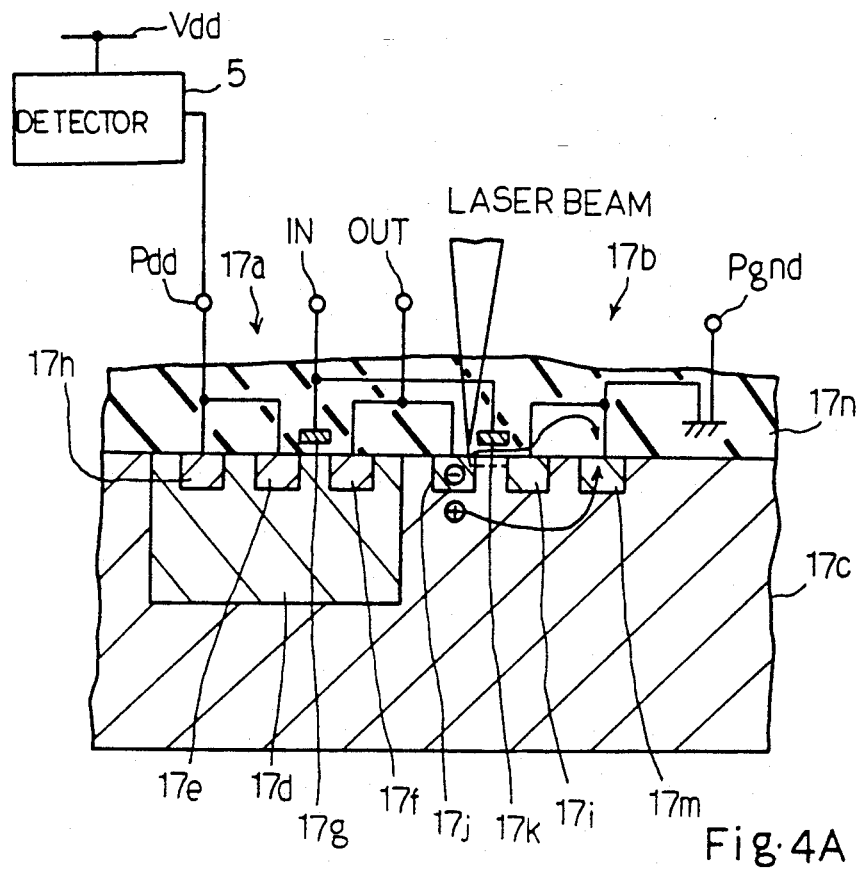
FIG. 4A and 4B are cross sectional views showing the structure of the complementary inverter in the presence of the input data signal of logic "1" and logic "0" levels.
Figure 4B:
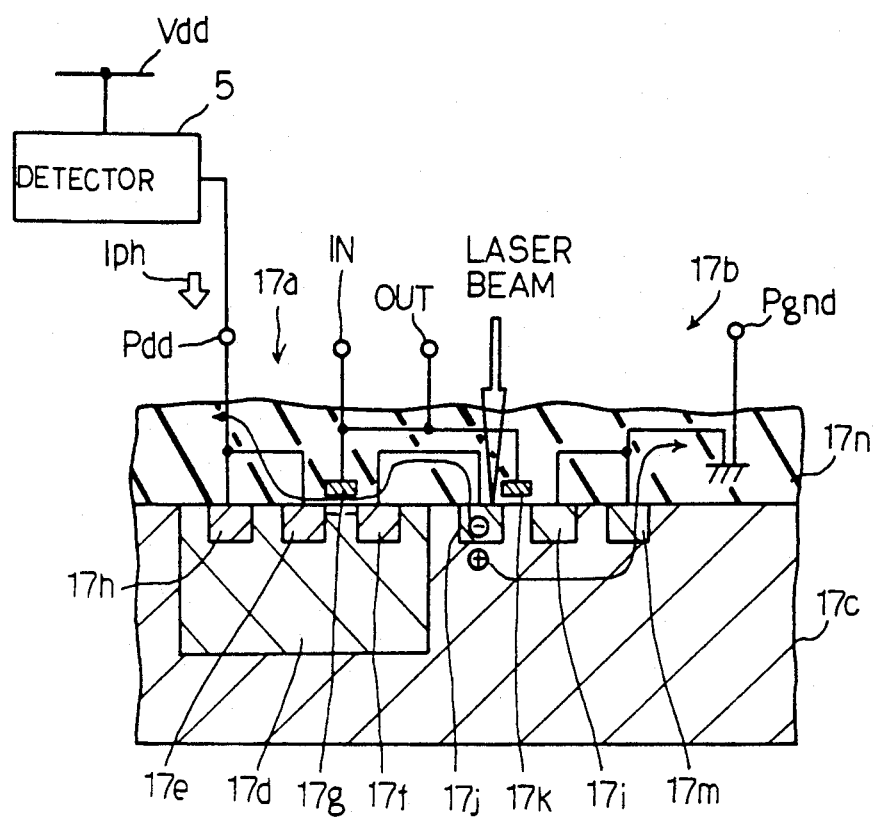
Figure 6:
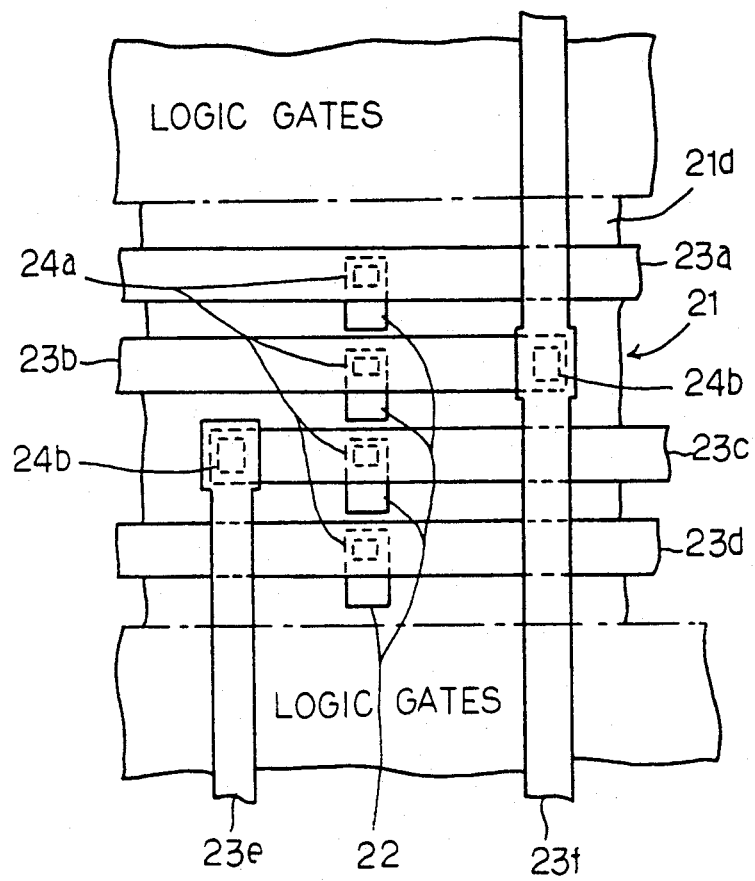
FIG. 6 is a plan view showing a part of the semiconductor integrated circuit device encircled by broken line A in an enlarged scale.

As will be better seen from FIG. 6, n-type impurity regions 22 are formed in the vacant area 21d, and do not form any part of circuit components of the integrated circuit. Although the major surface of the p-type semiconductor substrate 21 is covered with an inter-level insulting film structure, the inter-level insulating film structure is removed from the structure shown in FIG. 2, and wiring strips 23a, 23b, 23c, 23d, 23e and 23f extend over the major surface. The wiring strips 23a to 23f form parts of a multi-level wiring structure which is coupled between the logic gates and between the logic gates and the input and output circuits. The width of the wiring strips 23a to 23f are standardized, and the gaps therebetween are also standardized. The writing strips 23a to 23d extend on a lower level of the multi-level insulating film structure in parallel to the longitudinal direction of the vacant area 21d, and are held in contact through contact holes 24a with the impurity regions 22, respectively. On the other hand, the wiring strips 23e and 23f extend on a higher level of the multi-level insulating film structure in perpendicular to the wiring strips 23a to 23d, and are respectively held in contact through contact holes 24b with the wiring strips 23c and 23b. Although the n-type impurity regions 22 are partially overlapped with the wiring strips 23a to 23d, parts of the n-type impurity regions 22 are seen from between the wiring strips 23a to 23f, and a laser beam is sequentially irradiated from an analyzer onto the n-type impurity regions 22 in the non-contact and non-destructive analyzing method. The laser beam is about 1 micron in diameter, and each of the n-type impurity regions 22 is 2 microns in width. For this reason, even though the complementary field effect transistors are designed by using the sub-micron design rules, the laser beam is surely fallen onto each n-type impurity region 22, and no multiple selection takes place. The n-type impurity regions 22 are much smaller than the vacant area 21d, and a designer can previously assign the appropriate positions to the n-type impurity regions 22. In this instance, the n-type impurity regions 22 are arranged in the vacant area 21d along a virtual line X1, and arrays each consisting of the four n-type impurity regions 22 shown in FIG. 6 are arranged at spacings along a virtual line Y1. As a result, each of the four tracks is associated with one of the n-type impurity regions 22 in the direction of width of the vacant area 21d. However, one of the n-type impurity regions 22 may be associated with a predetermined track, and the n-type impurity regions 22 may be offset from one another with the tracks.

Second Embodiment

Figure 7:
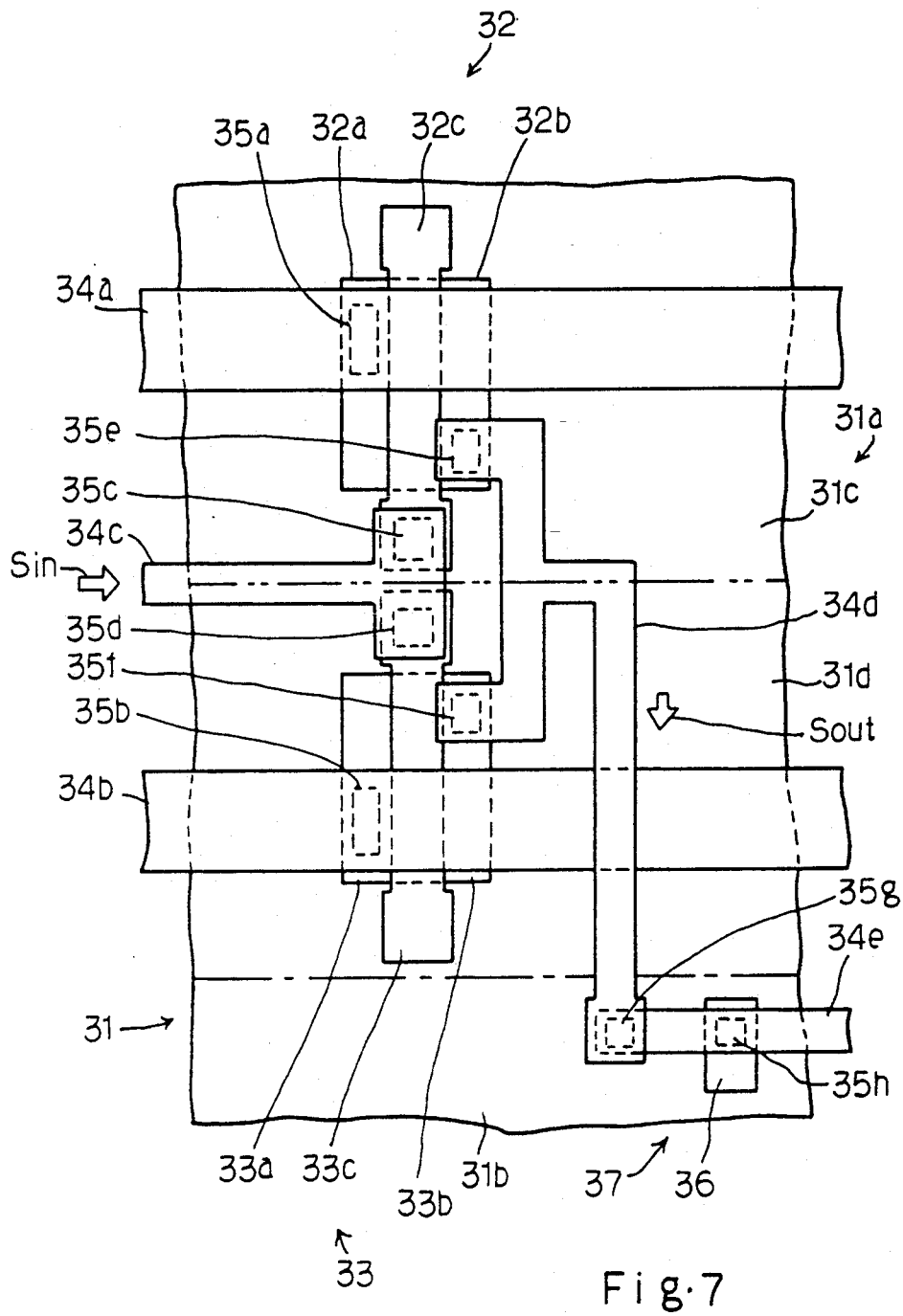
FIG. 7 is a plan view showing the arrangement of a complementary inverter incorporated in another semiconductor integrated circuit device according to the present invention.

Turning to FIG. 7 of the drawings, a complementary inverter incorporated in another semiconductor integrated circuit device embodying the present invention is fabricated on a p-type single semiconductor substrate 31, and gate insulating films and a multi-level insulating film structure are deleted from FIG. 7 for better understanding of the layout. The major surface of the p-type semiconductor substrate 31 has a device area 31a assigned to circuit components such as the complementary inverter and a wiring area 31b assigned to wiring strips, an n-type well 31c is defined in the device area 31a so that a p-type area 31d is exposed to the major surface of the substrate 31.

In the n-type well 31c, a p-type source region 32a and a p-type drain region 32b are formed, and a gate electrode 32c is provided on the gate insulating film over a channel region between the p-type source region 32a and the p-type drain region 32b. The p-type source region 32a, the p-type drain region 32b, the gate insulating film over the channel region and the gate electrode 32c form in combination a p-channel enhancement type field effect transistor 32.

On the other hand, an n-type source region 33a and an n-type drain region 33b are formed in the p-type area 31d, and a gate electrode 33c is provided on a gate insulating film over a channel region between the n-type source region 33a and the n-type drain region 33b. The n-type source region 33a, the n-type drain region 33b, the gate insulating film and the gate electrode 33c as a whole constitute an n-channel enhancement type field effect transistor 33.

A power supply line 34a extends over the gate electrode 32c, and is held in contact through a contact hole 35a formed in the multi-level insulating film structure with the p-type source region 32a for supplying a positive power voltage level Vdd. Another power supply line 34b extends over the gate electrode 33c, and is held in contact through a contact hole 35b also formed in the multi-level insulating film structure with the n-type source region 33a for supplying the ground voltage level. An input signal line 34c and an output signal line 34d also extend in the multi-level insulating film structure, and are respectively held in contact through contact holes 35c and 35d with the gate electrodes 32c and 33c and through contact holes 35e and 35f with the p-type drain region 32b and the n-type drain region 33b. The p-channel enhancement type field effect transistor 32 and the n-channel enhancement type field effect transistor 33 thus coupled form the complementary inverter, and complementarily turns on and off depending upon an input data signal Sin on the input data line 34c.

In order to interconnect the output signal line 34d and a pin (not shown) of the semiconductor integrated circuit device, the output signal line 34d projects into the multi-level insulating film structure over the wiring area 31b, and is coupled through a contact hole 35g with a standardized wiring strip 34e. The standardized wiring strip 34e propagates an output data signal Sout to the pin.

An n-type impurity region 36 is formed in the wiring area 31b, and serves as an irradiated impurity region. The n-type impurity region 36 is held in contact through a contact hole 35h with the standardized wiring strip 34e, and is wider than the standardized wiring strip 34e. The power supply lines 34a and 34b, the signal lines 34c and 34d and the standardized wiring strip 34e form parts of a multi-level wiring structure. Although the standardized wiring strip 34e is partially overlapped with the n-type impurity region 36, the multi-level wiring structure allows the n-type impurity region 36 to be exposed to an optical radiation such as a laser probe.

The n-type impurity region 36 and the p-type semiconductor substrate 31 serves as a diode 37, and the diode 37 is coupled between the n-type source region 33a and the n-type drain region 33b, because the p-type semiconductor substrate is biased with the ground voltage level.

Figure 8:
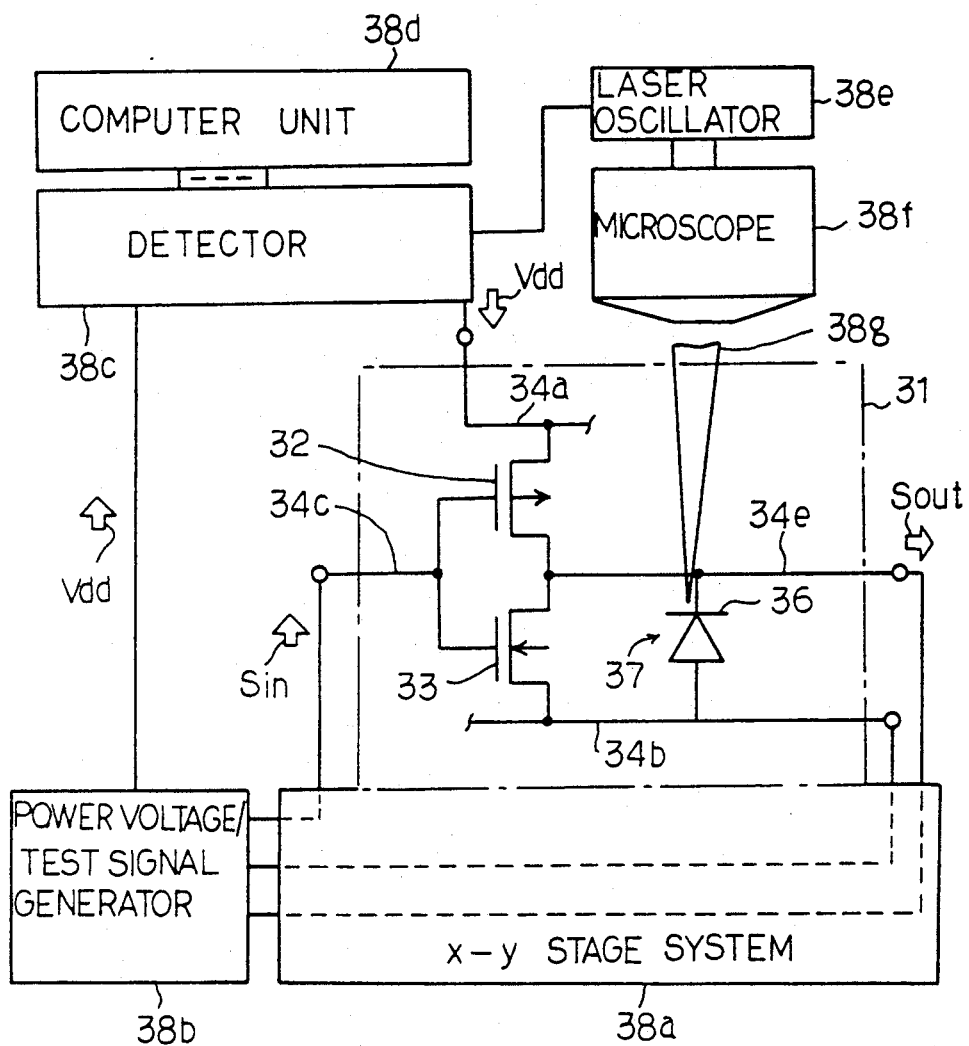
FIG. 8 is a circuit diagram showing the complementary inverter subjected to a non-contact and non-destructive analysis using a laser beam.

Description is made on a non-contact and non-destructive analysis for the semiconductor integrated circuit device shown in FIG. 7. The non-contact and non-destructive analyzer is similar to that of the prior art, and comprises an x-y state system 38a, a power voltage/test signal generator 38b, a detector 38c, a computer 38d, a laser oscillator 38e and a microscope 38f as shown in FIG. 8 The detector 38c is also implemented by a series combination of a resistor, an amplifier circuit and an analog-to-digital converter, and the positive power voltage Vdd is supplied through the resistor to the power supply line 34a. The laser oscillator 38e supplies a laser beam, and the microscope 38f and the x-y stage system 38a focus the laser beam 38 on the n-type impurity region 36.

While the microscope 38f irradiates the laser beam 38g onto the n-type impurity region 36, electron-hole pairs are produced at the p-n junction between the n-type impurity region 36 an the p-type semiconductor substrate 31. As described hereinbefore, the multi-level wiring structure allows the laser beam 38g to reach the n-type impurity region 36. If the power voltage/test signal generator 38b supplies the input data signal Sin of logic "1" level to the input signal line 34c, the p-channel enhancement type field effect transistor 32 turns off, and the n-channel enhancement type field effect transistor 33 turns on. Then, the electrons are recombined with the holes through the n-channel enhancement type field effect transistor 33, and any optical beam induced current is not produced.

However, if the input data signal Sin is changed to logic "0" level, the p-channel enhancement type field effect transistor 32 turns on, and the n-channel enhancement type field effect transistor 33 turns off. Then, the holes are discharged to the power voltage line 34b, and the electrons flows through the p-channel enhancement type field effect transistor 32 into the power supply line 34a. The electrons causes optical beam induced current to flow through the resistor of the detector 38c, and the switching action is detectable as voltage variance at the resistor.

Third Embodiment

Figure 9:
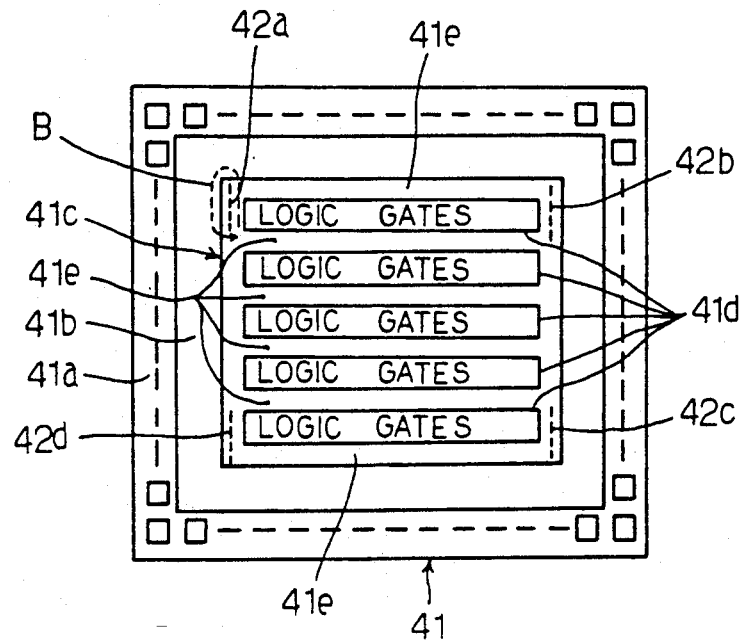
FIG. 9 is a plan view showing the layout of yet another semiconductor integrated circuit device according to the present invention.

Turning to FIG. 9 of the drawings, yet another semiconductor integrated circuit device embodying the present invention is fabricated on a semiconductor chip 41. The major surface of the semiconductor chip 41 is also divided into an outermost peripheral area 41a assigned to bonding pads, an inner peripheral area 41b assigned to input and output circuits and a central area assigned to logic gates and standardized wirings. The logic gates are arranged in rows, and device sub-areas 41d assigned to the logic gates are spaced in the central area 41c like islands. Wiring sub-areas 41e assigned to standardized wirings surround the device sub-areas 41d.

In this instance, irradiated impurity regions 42a, 42b, 42c ad 42d are located at the four corners of the central area 41c, and do not form any part of the circuit components of the integrated circuit. The irradiated impurity regions 42a to 42d are opposite in conductivity type from the semiconductor substrate, and are physically separated from one another. For this reason, the irradiated impurity regions 42a to 42d are electrically isolated from one another.

Figure 10:
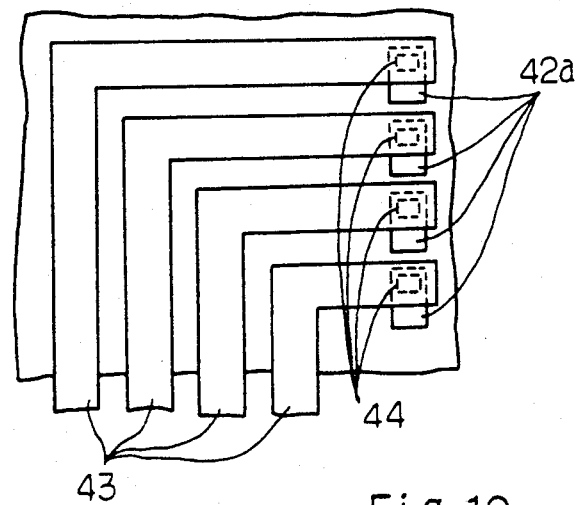
FIG. 10 is a plan view showing a part of the layout incorporated in the semiconductor integrated circuit device encircled by broken lines in an enlarged scale.

As will be better seen from FIG. 10, standardized wirings 43 are patterned in a multi-level insulating film structure (not shown), and are held in contact through contact holes 44 with the irradiated impurity regions 42a. The standardized wiring strips 43 form parts of a multi-level wiring structure, and the multi-level wiring structure allows a laser probe to reach any one of the irradiated impurity regions 42a to 42d. Since the irradiated impurity regions 42a to 42d are located closer to both ends of the rows of gate arrays, the irradiated impurity regions 42a to 42d are convenient for circuit components in the vicinity of the input and output circuits.

Figure 11:
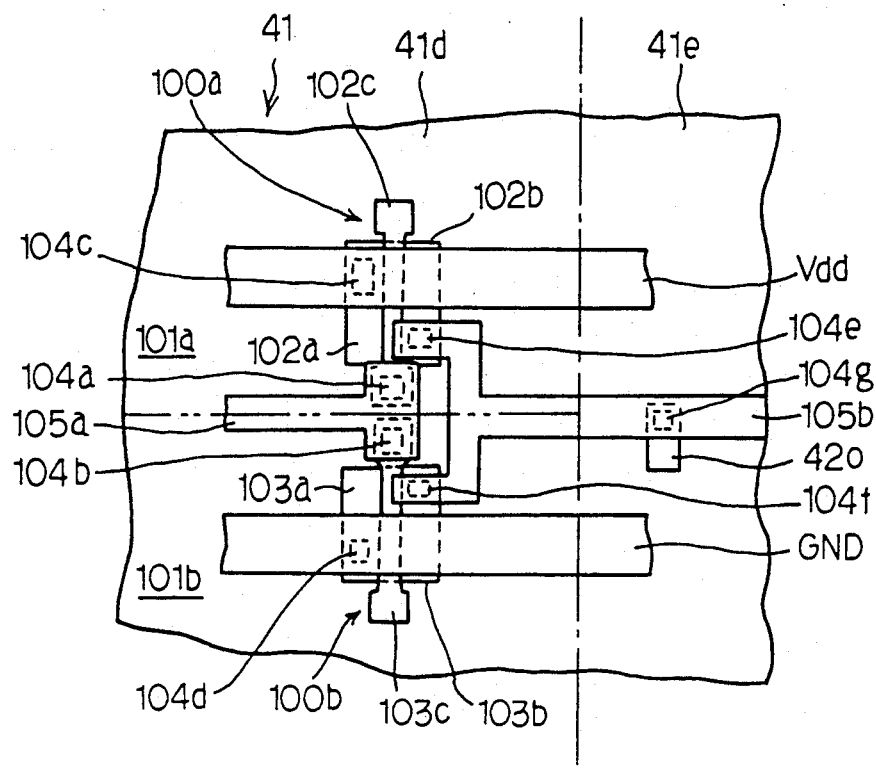
FIG. 11 is a plan view showing the layout of a component logic gate incorproated in the semicoductor integrated circuit device.

Turning to FIG. 11 of the drawings, a logic gate is formed in the device sub-area 41d, and is implemented by a complementary inverter. Although a thin gate insulating film and a multi-level insulating film structure cover the major surface of the semiconductor substrate 41, they are deleted from the layout shown in FIG. 11 for the sake of simplicity. The complementary inverter comprises a p-channel enhancement type field effect transistor 100a assigned to an n-type area 101a and an n-channel enhancement type field effect transistor 100b assigned to a p-type area 101b. The p-channel enhancement type field effect transistor 100a comprises p-type source and drain regions 102a and 102b formed in the n-type area 101a, a thin gate insulating film (not shown) and a gate electrode 102c provided on the thin gate insulating film over a channel region between the p-type source and drain regions 102a and 102b. Similarly, the n-channel enhancement type field effect transistor 100b comprises n-type source and drain regions 103a and 103b formed in the p-type area 101b, a thin gate insulating film (not shown) and a gate electrode 103c provided on the thin gate insulating film over a channel region between the p-type source and drain regions 103a and 103b.

Figure 12:
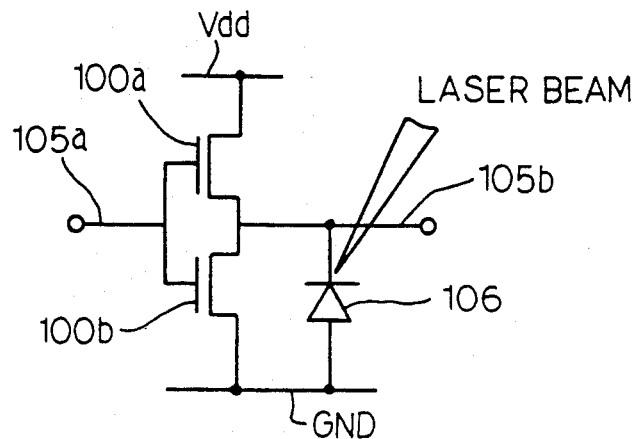
FIG. 12 is a circuit diagram showing an equivalent circuit of the component logic gate.

The gate electrodes 102c and 103c are coupled through contact holes 104a and 104b with a wiring strip serving as an input signal line 105a, and the source regions 102a and 103a are coupled through contact holes 104c and 104d with a positive power voltage line Vdd and a ground voltage line GND. The drain regions 102b and 103b are coupled through contact holes 104e and 104f with a wiring strip 105b serving as an output signal line 105b, and the output signal line 105b extend over the wiring sub-area 41e. In the wiring sub-area 41e, the output signal line 105b is coupled through a contact hole 104g with a heavily doped n-type region 420 serving as one of the irradiated impurity regions 42a to 42d. The heavily doped n-type region 420 and the p-type semiconductor substrate 41 form a diode 106 as shown in FIG. 12, and the laser beam is fallen upon the diode 106.

Figure 13A:
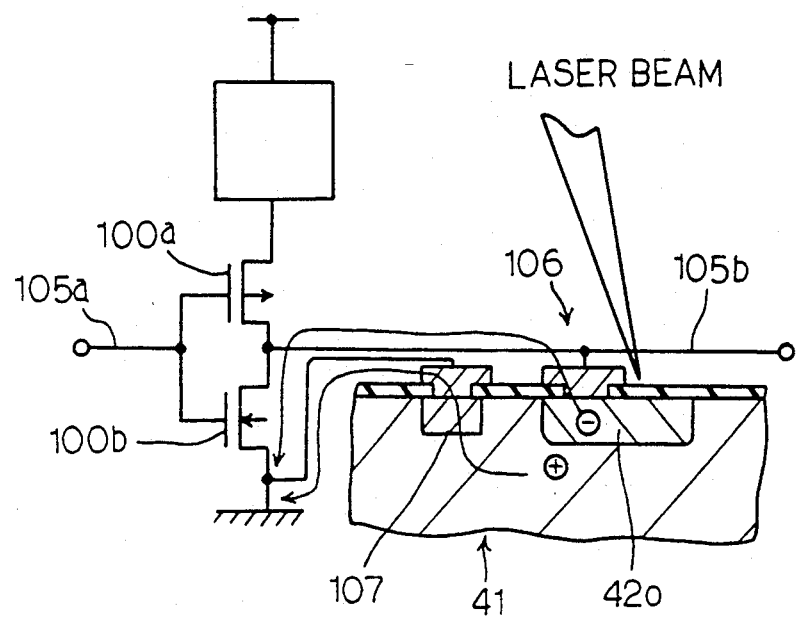
FIGS. 13A and 13B are views showing optical beam induced current at different conditions.

If an input signal of logic "1" level corresponding to high voltage level, the n-channel enhancement type field effect transistor 100b turns on, and the p-channel enhancement type field effect transistor 100a turns off. Laser beam radiated onto the diode 106 produces electron-hole pairs at the p-n junction of the diode 106, and the holes flow through a p-type contact region 107 to the ground voltage line GND as shown in FIG. 13A. On the other hand, the electrons flow from the heavily doped n-type region 420 through the output signal line 105b to the drain region of the n-channel type field effect transistor 100b. Since the n-channel enhancement type field effect transistor 100b is turned on, the electrons pass the n-channel enhancement type field effect transistor 100b, and are recombined with the holes. As a result, any optical beam induced current is not measured.

Figure 13B:
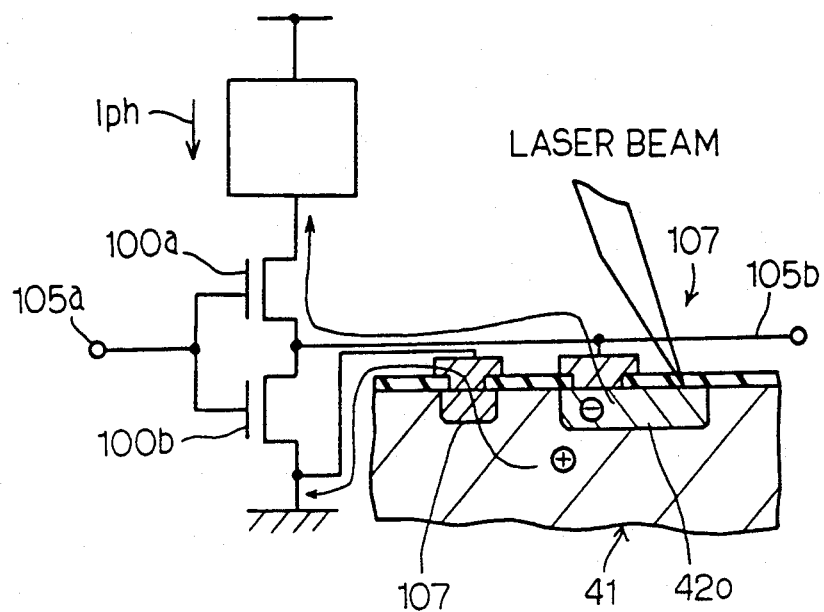

If an input signal of logic "0" level corresponding to low voltage level, the n-channel enhancement type field effect transistor 100b turns off, and the p-channel enhancement type field effect transistor 100a turns on. The laser beam radiated onto the diode 106 produces electron-hole pairs at the p-n junction of the diode 106 again, and the holes flow through the p-type contact region 107 to the ground voltage line GND as shown in FIG. 13B. On the other hand, the electrons flow from the heavily doped n-type region 420 through the output signal line 105b to the drain region of the n-channel type field effect transistor 100b. However, the n-channel enhancement type field effect transistor 100b is turned off, the electrons pass the p-channel enhancement type field effect transistor 100a, and are detected as optical beam induced current Iph.

As will be appreciated from the foregoing description, the semiconductor integrated circuit device according to the present invention has the irradiated impurity regions in the wiring area assigned to the standardized wiring strips, and the irradiated impurity regions are located at the appropriate positions free from the complexity of the multi-level wiring structure and from the miniaturization of the component transistors. The irradiated impurity regions is easily designed, because the circuit arrangement does not affect the locations thereof. Moreover, if the irradiated impurity regions are patterned in the wiring area, the laser beam can sequentially irradiate the irradiated impurity regions, and the analysis is easily synchronized with a logical simulation.

Although particular embodiments of the present invention have been shown and described, it will be obvious to those skilled in the art that various changes and modifications may be made without departing from the spirit and scope of the present invention. For example, the present invention is applicable to any semiconductor integrated circuit device, and the irradiated impurity regions may be formed at any area on the major surface of the semiconductor substrate. Moreover, the irradiated impurity regions may be formed between the rows of logic gates as well as the outside of the rows of logic gates. Additionally, the irradiated impurity regions may not be associated with less important circuit components.

What is claimed is:

1. A semiconductor integrated circuit device fabricated on a single semiconductor substrate of one conductivity type having a major surface, said device comprising:
    a) circuit components formed in a first area assigned thereto in said major surface;
    b) a multilayer wiring structure provided over said major surface, and having wiring strips extending over a second area defined in said major surface and selectively coupled with said circuit components;
    c) a plurality of impurity regions of the opposite conductivity type formed in said second area and selectively connected with said wiring strips, an optical radiation being radiated through said wiring strips and onto said plurality of impurity regions for producing carriers; and
    d) at least one terminal electrically connected with one of said wiring strips so that said carriers are detectable through said one of said wiring strips and one of said circuit components.

2. A semiconductor integrated circuit device as set forth in claim 1, in which said first area and said second area respectively have a plurality of first sub-areas and a plurality of second sub-areas, said plurality of first sub-areas alternating with said plurality of second sub-areas.

3. A semiconductor integrated circuit device as set forth in claim 1, in which said first area is surrounded by said second area.

4. A semiconductor integrated circuit device as set forth in claim 1, in which said plurality of impurity regions are arranged in a predetermined pattern so as to allow said wiring strips extending over said second area to be coupled with impurity regions selected from said irradiated regions.

* * * * *